United States Patent
U'Ren et al.

(10) Patent No.: US 6,861,308 B2
(45) Date of Patent: Mar. 1, 2005

(54) METHOD FOR FABRICATION OF SIGE LAYER HAVING SMALL POLY GRAINS AND RELATED STRUCTURE

(75) Inventors: Gregory D. U'Ren, Corona del Mar, CA (US); Sy Vo, Ladera Ranch, CA (US)

(73) Assignee: Newport Fab, LLC, Newport Beach, CA (US)

( * ) Notice: Subject to any disclaimer, the term of this patent is extended or adjusted under 35 U.S.C. 154(b) by 0 days.

(21) Appl. No.: 10/437,530

(22) Filed: May 13, 2003

(65) Prior Publication Data

US 2004/0227157 A1 Nov. 18, 2004

(51) Int. Cl.$^7$ .......................................... H01L 21/8249
(52) U.S. Cl. ...................................... 438/235; 438/488
(58) Field of Search ................................. 438/235, 309, 438/310, 311, 368, 437, 488

(56) References Cited

U.S. PATENT DOCUMENTS 6,534,802 B1 * 3/2003 Schuegraf ................... 257/194

* cited by examiner

*Primary Examiner*—Phuc T. Dang
(74) *Attorney, Agent, or Firm*—Farjami & Farjami LLP

(57) ABSTRACT

A disclosed embodiment is a method for fabricating a SiGe layer, the method comprising depositing a silicon buffer layer over a single crystalline region and at least one isolation region at a first pressure, where the silicon buffer layer is continuous, i.e. comprises small poly grains, over the at least one isolation region. The method further includes forming a silicon germanium layer over the silicon buffer layer at a second pressure, where the silicon germanium layer is also continuous, i.e. comprises small poly grains, over the at least one isolation region. In one embodiment, the first pressure is less than the second pressure. In other embodiments, a structure is fabricated according to the above method.

16 Claims, 3 Drawing Sheets

FIG. 2

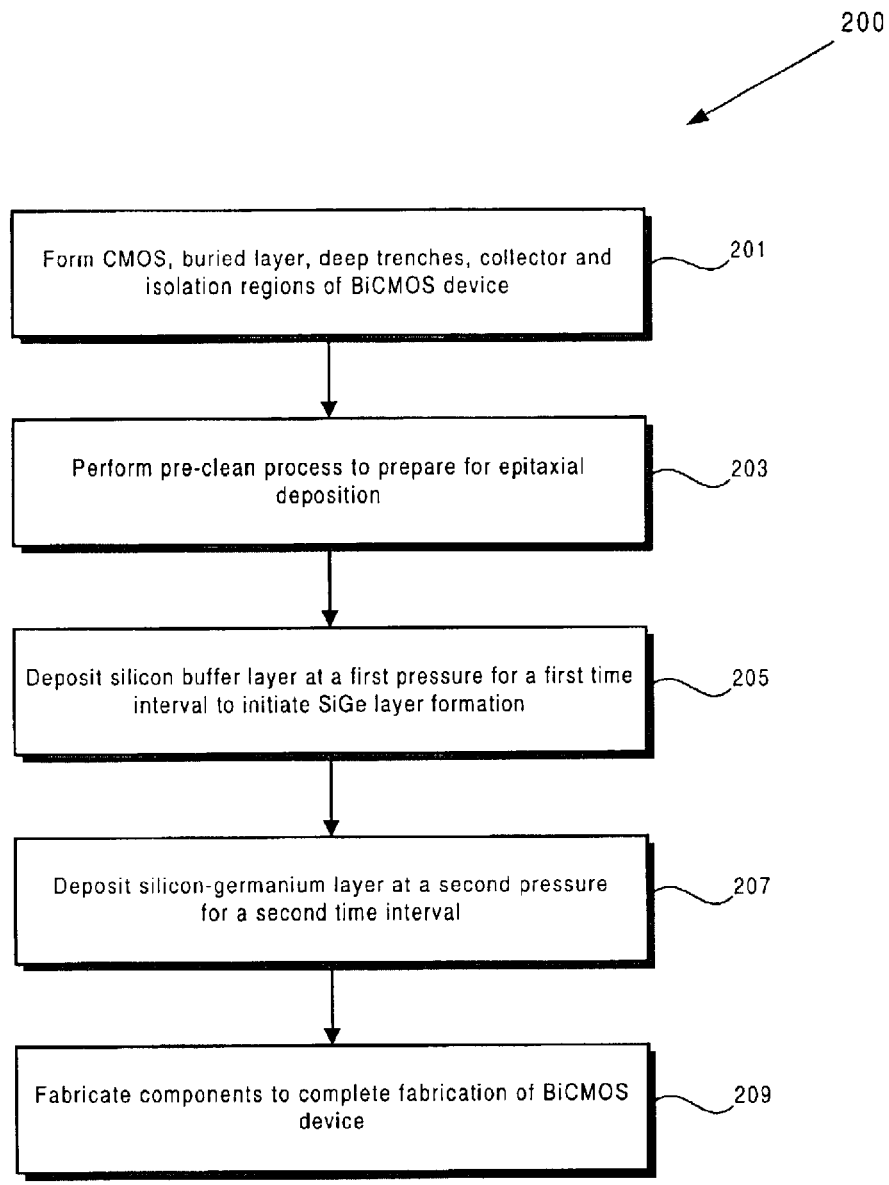

- 201 — Form CMOS, buried layer, deep trenches, collector and isolation regions of BiCMOS device
- 203 — Perform pre-clean process to prepare for epitaxial deposition
- 205 — Deposit silicon buffer layer at a first pressure for a first time interval to initiate SiGe layer formation
- 207 — Deposit silicon-germanium layer at a second pressure for a second time interval
- 209 — Fabricate components to complete fabrication of BiCMOS device

US 6,861,308 B2

METHOD FOR FABRICATION OF SIGE LAYER HAVING SMALL POLY GRAINS AND RELATED STRUCTURE

BACKGROUND OF THE INVENTION

1. Field of the Invention

The present invention is generally in the field of semiconductor fabrication. More specifically, the invention is in the field of fabricating SiGe layers in a BiCMOS process.

2. Background Art

In silicon germanium ("SiGe") bipolar CMOS ("BiCMOS") technology, SiGe heterojunction bipolar transistors ("HBT") and CMOS transistors are concurrently fabricated in a single semiconductor die. Fabricating SiGe HBTs requires forming, among other things, a collector, isolation regions and a base. During formation of a SiGe HBT in a SiGe BiCMOS device, a SiGe layer is deposited over the collector and isolation regions to form, respectively, a single crystal SiGe base and a SiGe polycrystalline layer contacting the single crystal SiGe base. It is noted that such SiGe layer deposition is termed "nonselective," since a blanket SiGe layer is deposited in a "nonselective" manner over the entire surface of the die, but the structure of the SiGe layer will depend on the material it is deposited over. In particular, a single crystalline SiGe layer grows over the collector, whereas a polycrystalline ("poly") SiGe layer grows over the shallow trench isolation ("STI") regions—where the SiGe layer conventionally forms large poly grains. As stated above, the poly SiGe thus formed is typically utilized for electrical connection to the single crystal SiGe base of the HBT.

Disadvantageously, SiGe layers comprising large poly grains result in areas of increased surface roughness and "non-continuities" due to voids between the large poly grains. These areas and non-continuities reduce electrical conductance because current must find a path around them. Also, non-continuities due to existence of the large poly grains result in reduced protection of underlying layers, such as the underlying CMOS structures, during etching steps associated with a BiCMOS process.

Therefore, a need exists in the BiCMOS technology for fabricating SiGe layers having small poly grains, which result in increased continuity and decreased surface roughness, which increase conductivity and decrease potential damage to CMOS structures during etching steps in a BiCMOS process.

SUMMARY OF THE INVENTION

The present invention is directed to method for fabrication of SiGe layer having small poly grains and related structure. The invention overcomes the need in the art for SiGe layers that include small poly grains, which results in increased continuity and decreased surface roughness, which increases conductivity and decreases potential damage to CMOS structures during fabrication.

According to one embodiment, the present invention is a method for fabricating a SiGe layer, the method comprising depositing a silicon buffer layer over a single crystalline region and at least one isolation region at a first pressure, where the silicon buffer layer is continuous, i.e. comprises small poly grains, over the at least one isolation region. The method further includes forming a silicon germanium layer over the silicon buffer layer at a second pressure, where the silicon germanium layer is also continuous, i.e. comprises small poly grains, over the at least one isolation region. In one embodiment, the first pressure is less than the second pressure. For example, the first pressure can be less than or equal to approximately 50 Torr and the second pressure can be greater than or equal to approximately 100 Torr. In other embodiments, the present invention is a structure fabricated according to the above method. Other features and advantages of the present invention will become more readily apparent to those of ordinary skill in the art after reviewing the following description and accompanying drawings.

BRIEF DESCRIPTION OF THE DRAWINGS

FIG. 2 shows a flowchart illustrating the steps taken to implement an embodiment of the invention.

DETAILED DESCRIPTION OF THE INVENTION

The present invention is directed to method for fabrication of SiGe layer having small poly grains and related structure. The following description contains specific information pertaining to the implementation of the present invention. One skilled in the art will recognize that the present invention may be implemented in a manner different from that specifically discussed in the present application. Moreover, some of the specific details of the invention are not discussed in order to not obscure the invention. The specific details not described in the present application are within the knowledge of a person of ordinary skill in the art.

The drawings in the present application and their accompanying detailed description are directed to merely exemplary embodiments of the invention. To maintain brevity, other embodiments of the invention which use the principles of the present invention are not specifically described in the present application and are not specifically illustrated by the present drawings.

Figure 1:
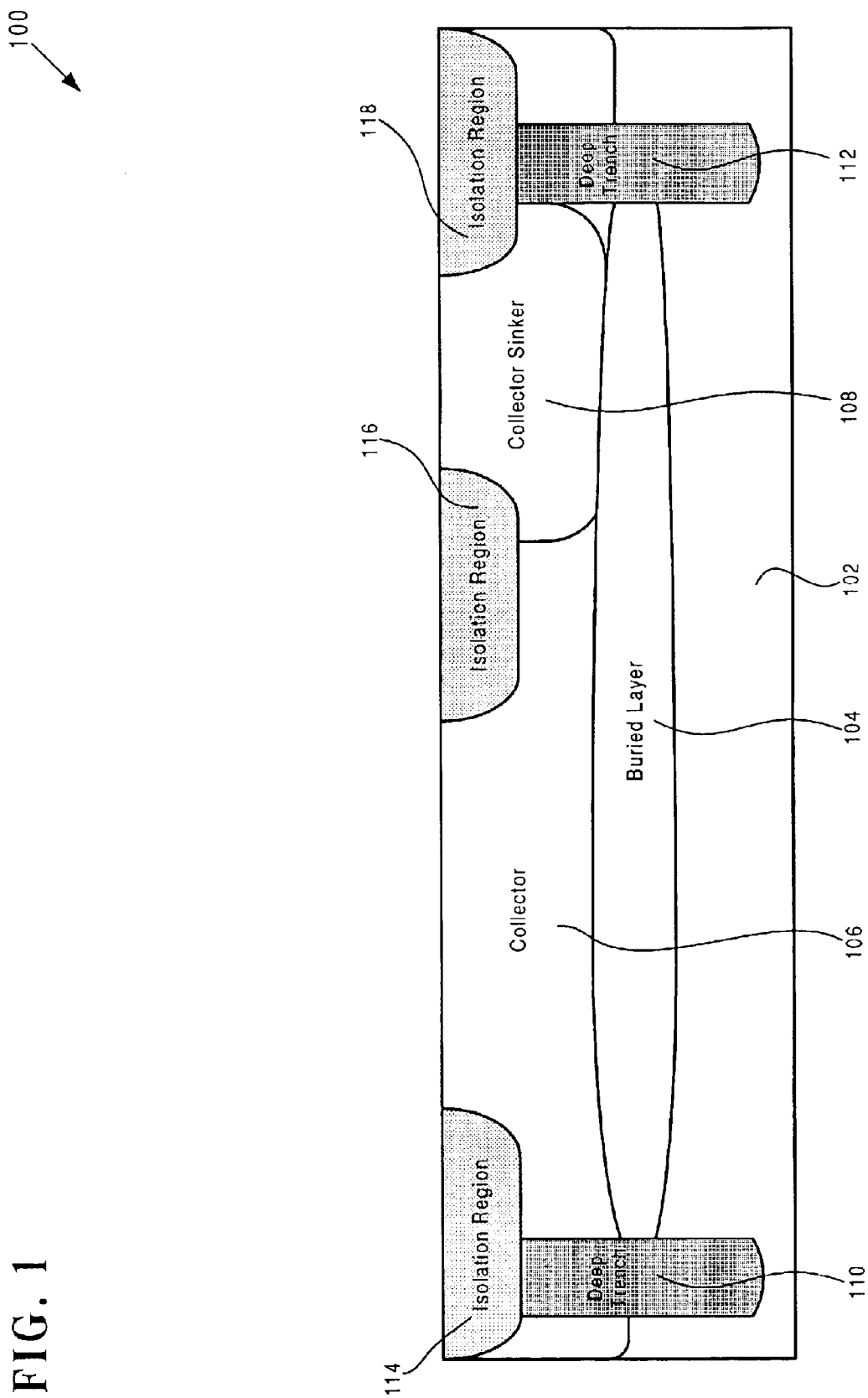
FIG. 1 shows a cross-sectional view of some of the features of an exemplary SiGe BiCMOS structure prior to application of the steps taken to implement an embodiment of the present invention.

FIG. 1 shows a cross-sectional view of various features and components of an exemplary SiGe BiCMOS structure prior to application of the steps taken to implement an embodiment of the present invention. Certain details and features have been left out which are apparent to a person of ordinary skill in the art. Structure 100 includes, among other things, substrate 102, buried layer 104, collector 106, collector sinker 108, deep trenches 110 and 112 and isolation regions 114, 116, and 118. Buried layer 104 is situated in substrate 102, which can be formed by implant doping. Collector sinker 108 is situated above, and in contact with, buried layer 104. Collector sinker 108 can be formed by diffusion of heavily concentrated dopants from the surface of collector sinker 108 down to buried layer 104. Buried layer 104 and collector sinker 108 comprise N+ type material, i.e. relatively heavily doped N type material. Buried layer 104 and collector sinker 108, provide a low resistance electrical pathway from collector 106 to a collector contact (not shown in any of the Figures).

As shown in FIG. 1, collector 106 is situated over, and is in contact with, buried layer 104. Collector 106 comprises N type single crystalline silicon, which can be deposited epitaxially using a reduced pressure chemical vapor deposition ("RPCVD") process. As seen in FIG. 1, deep trench structures 110 and 112 and isolation regions 114, 116, and 118 provide electrical isolation from other devices on substrate 102. Deep trench structures 110 and 112 are formed in substrate 102. Isolation regions 114, 116, and 118, which are composed of non-thermal oxide, can be formed by a STI process.

FIG. 2 shows a flowchart illustrating exemplary process steps taken to implement an embodiment of the invention. Certain details and features have been left out of flowchart 200 of FIG. 2 that are apparent to a person of ordinary skill in the art. For example, a step may consist of one or more sub-steps or may involve specialized equipment or materials, as known in the art. While steps 201 through 209 shown in flowchart 200 are sufficient to describe one embodiment of the present invention, other embodiments of the invention may utilize steps different from those shown in flowchart 200.

Figure 3A:
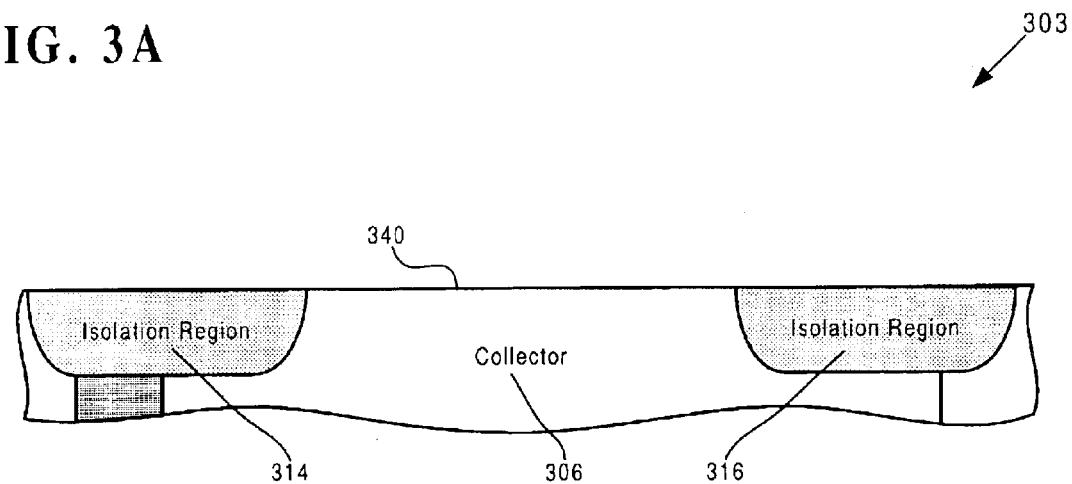
FIG. 3A shows a cross-sectional view of some of the features of an exemplary SiGe HBT after performance of step 203 of FIG. 2, formed in accordance with one embodiment of the invention.
Figure 3B:
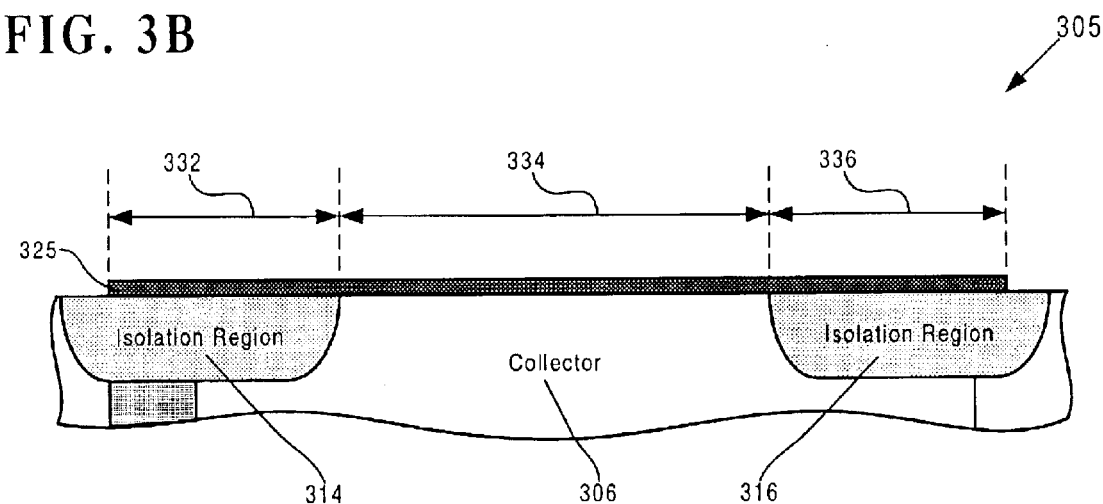
FIG. 3B shows a cross-sectional view of some of the features of an exemplary SiGe HBT after performance of step 205 of FIG. 2, formed in accordance with one embodiment of the invention.
Figure 3C:
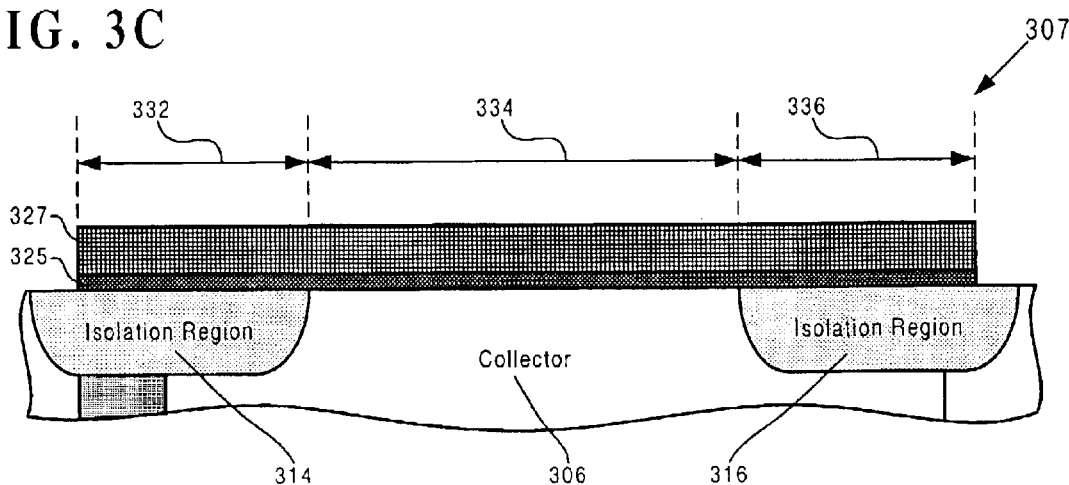
FIG. 3C shows a cross-sectional view of some of the features of an exemplary SiGe HBT after performance of step 207 of FIG. 2, formed in accordance with one embodiment of the invention.

FIGS. 3A, 3B and 3C show cross-sectional views of some of the features of an exemplary SiGe HBT in intermediate stages of fabrication, formed in accordance with one embodiment of the invention. These intermediate stages of fabrication show some of the features of base fabrication of an exemplary SiGe HBT structure, formed in accordance with one exemplary embodiment of the present invention. These fabrication stages are described in greater detail below in relation to flowchart 200 of FIG. 2.

Referring to FIGS. 2 and 3A, at step 201 in flowchart 200, a CMOS device, a buried layer, deep trenches (all not shown in FIG. 3A), collector 306 of a bipolar device and isolation regions 314 and 316 are formed in a P substrate (not shown in FIG. 3A). Collector 306 and isolation regions 314 and 316 in FIG. 3A are analogous to collector 106 and isolation regions 114 and 116 in FIG. 1, respectively. Isolation regions 314 and 316 comprise a non-thermal oxide, which can be formed by a STI process. Collector 306 comprises N type single crystalline silicon which can be deposited epitaxially using a RPCVD process.

At step 203 in flowchart 200, a "pre-clean" process comprising an "HF wet clean" process and an "oxide removal" process is performed on structure 303, which removes an oxide layer (not shown) from top surface 340 and prepares top surface 340 for epitaxial deposition. In one embodiment, the oxide removal process can comprise a bake in hydrogen at a temperature ranging between approximately 800 degrees Centigrade ("C") and approximately 1000 degrees C., followed by a reduction in temperature to processing temperature, which can be less than approximately 700 degrees C. In one embodiment, the processing temperature is approximately 670 degrees C.

Referring to FIGS. 2 and 3B, at step 205 in flowchart 200, silicon buffer layer 325 is deposited over isolation region 314, collector 306 and isolation region 316 at portions 332, 334 and 336, respectively, to initiate SiGe layer formation. As described further below, in accordance to the present invention, silicon buffer layer 325 comprises small poly grains at portions 332 and 336, although conventionally large poly grains are formed over non-thermal oxide of shallow trench isolation regions 314 and 316. Silicon buffer layer 325 comprises single crystalline silicon at portion 334 due to collector 306 comprising single crystalline silicon.

According to the present invention and during step 205, silicon buffer layer 325 is deposited at a first reduced pressure for a first time interval to form a small grain "nucleation" layer in silicon buffer portions 332 and 336 which are situated, respectively, over non-thermal oxide shallow trench isolation regions 314 and 316. Depositing silicon buffer layer 325, at a first reduced pressure, advantageously controls nucleation of silicon buffer layer 325 to result in small poly grains over isolation regions 314 and 316. In one embodiment, the reduced pressure is less than or equal to approximately 50 Torr which is applied for a time interval of approximately 200 seconds. Silicon buffer layer 325 can be deposited at a temperature of less than approximately 700 degrees C. In one embodiment, silicon buffer layer 325 is deposited at approximately 670 degrees C.

Referring to FIGS. 2 and 3C, at step 207 in flowchart 200, silicon germanium layer 327 is deposited over silicon buffer layer 325 at a second increased pressure for a second time interval. In other words, the second pressure of step 207 is higher than the first pressure of step 205. In one embodiment, the second pressure is greater than or equal to approximately 100 Torr and the second time interval is approximately 600 seconds. Silicon germanium layer 327 can be deposited at a temperature of less than approximately 700 degrees C. In one embodiment, silicon germanium layer 327 is deposited at a temperature of approximately 670 degrees C.

Silicon germanium layer 327 at portions 332 and 336 comprises small poly grains because the small poly grain structure of silicon buffer layer 325 at portions 332 and 336 is replicated during deposition of silicon germanium layer 327. SiGe layer 327 and silicon buffer layer 325 are referred to as "continuous" over isolation regions because they (i.e. silicon buffer layer 325 and SiGe layer 327) comprise small poly grains over isolation regions 314 and 316. More particularly, the term "continuous" is used in the present application to refer to SiGe poly material having grains that are significantly smaller than conventional SiGe poly materials formed over non-thermal oxide isolation regions. In sum, to form small poly grain SiGe layer 327, at step 205 a silicon buffer layer is deposited at a first reduced pressure to form a nucleation layer comprising small poly grains over isolation regions; and at step 207 a silicon germanium layer is deposited over the silicon buffer layer at a second increased pressure to replicate the small poly grains of the nucleation layer over isolation regions.

Structures formed over isolation regions in the manner above comprise tightly packed small poly grains, which advantageously increases continuity and decreases surface roughness, which increases conductivity of the SiGe poly situated over isolation regions 314 and 316 and decreases potential damage to CMOS structures during subsequent etching steps. As described above, conventional techniques disadvantageously form SiGe layers comprising large poly grains when grown over non-thermal oxide regions such as isolation regions 314 and 316. In the present invention, SiGe layer 327 at portions 332 and 336 advantageously comprises tightly packed small poly grains, which improves SiGe layer continuity and surface roughness.

Referring to FIG. 2, at step 209 in flowchart 200, additional components are fabricated to complete fabrication of the BiCMOS device. For example, an emitter can be formed over SiGe layer 327 of FIG. 3C. In sum, forming base structures during SiGe—BiCMOS integration in the manner described above advantageously forms a SiGe layer comprising small poly grains over isolation regions as compared to conventional techniques. Thus, increased continuity and decreased surface roughness is achieved due to the tightly packed small poly grain structure of the SiGe layer over isolation regions. Moreover, the present invention increases silicon germanium layer conductivity and decreases potential damage to CMOS structures during subsequent etching steps.

From the above description of the invention it is manifest that various techniques can be used for implementing the concepts of the present invention without departing from its scope. Moreover, while the invention has been described with specific reference to certain embodiments, a person of ordinary skill in the art would recognize that changes can be made in form and detail without departing from the spirit and the scope of the invention. The described embodiments are to be considered in all respects as illustrative and not restrictive. It should also be understood that the invention is not limited to the particular embodiments described herein, but is capable of many rearrangements, modifications, and substitutions without departing from the scope of the invention.

Thus, method for fabrication of SiGe layer having small poly grains and related structure have been described.

What is claimed is:

1. A method for fabricating a structure in a semiconductor die, said method comprising steps of:

performing a pre-clean process;

depositing a silicon buffer layer over a single crystalline region and at least one isolation region at a first pressure, wherein said silicon buffer layer is continuous over said at least one isolation region;

forming a silicon germanium layer over said silicon buffer layer at a second pressure, wherein said silicon germanium layer is continuous over said at least one isolation region.

2. The method of claim 1, wherein said step of performing said pre-clean process comprises performing said pre-clean process on said single crystalline region and said at least one isolation region.

3. The method of claim 1 wherein said first pressure is less than said second pressure.

4. The method of claim 1 wherein said first pressure is less than or equal to approximately 50 Torr.

5. The method of claim 1 wherein said second pressure is greater than or equal to approximately 100 Torr.

6. The method of claim 1, wherein said step of depositing said silicon buffer layer and said step of forming said silicon germanium layer are performed at a temperature less than or equal to approximately 700 degrees C.

7. The method of claim 1, wherein said step of depositing said silicon buffer layer and said step of forming said silicon germanium layer are performed at a temperature equal to approximately 670 degrees C.

8. The method of claim 1, wherein said step of depositing said silicon buffer layer over a single crystalline region and at least one isolation region at a first pressure is performed for a time interval equal to approximately 200 seconds.

9. The method of claim 1, wherein said step of forming said silicon germanium layer over said silicon buffer layer at a second pressure is performed for a time interval equal to approximately 600 seconds.

10. A method for fabricating a structure in a semiconductor die, said method comprising steps of:

performing a pre-clean process;

depositing a silicon buffer layer over a single crystalline region and at least one isolation region at a first pressure, wherein said silicon buffer layer deposited above said at least one isolation region is continuous;

forming a silicon germanium layer over said silicon buffer layer at a second pressure, wherein said first pressure is less than said second pressure, and wherein said silicon germanium layer formed above said at least one isolation region is continuous.

11. The method of claim 10 wherein said first pressure is less than or equal to approximately 50 Torr.

12. The method of claim 10 wherein said second pressure is greater than or equal to approximately 100 Torr.

13. The method of claim 10, wherein said step of depositing said silicon buffer layer and said step of forming said silicon germanium layer are performed at a temperature less than or equal to approximately 700 degrees C.

14. The method of claim 10, wherein said step of depositing said silicon buffer layer and said step of forming said silicon germanium layer are performed at a temperature equal to approximately 670 degrees C.

15. The method of claim 10, wherein said at least one isolation region is a STI region.

16. A method for fabricating a structure in a semiconductor die, said method comprising steps of:

depositing a silicon buffer layer over a single crystalline region and at least one isolation region at a first pressure, wherein said silicon buffer layer is continuous over said at least one isolation region forming a silicon germanium layer over said silicon buffer layer at a second pressure, wherein said silicon germanium layer is continuous over said at least one isolation region, wherein said first pressure is less than said second pressure.

* * * * *